United States Patent
Tokunaga (10) Patent No.: US 7,044,521 B2
(45) Date of Patent: May 16, 2006

(54) CHUCK AND SUCTION BOARD FOR PLATES

(75) Inventor: Haruo Tokunaga, Tokyo (JP)

(73) Assignee: Kuraitekku Co., Ltd., Tokyo (JP)

( * ) Notice: Subject to any disclaimer, the term of this patent is extended or adjusted under 35 U.S.C. 154(b) by 557 days.

(21) Appl. No.: 09/835,413

(22) Filed: Apr. 17, 2001

(65) Prior Publication Data

US 2001/0020763 A1 Sep. 13, 2001

Related U.S. Application Data (63) Continuation-in-part of application No. 09/463,951, filed as application No. PCT/JP99/03053 on Jun. 8, 1999, now abandoned.

(30) Foreign Application Priority Data

| Jun. 8, 1998 | (JP) | ............................................. 10-173798 |
| Apr. 18, 2000 | (JP) | ........................................ 2000-153811 |

(51) Int. Cl.
*B25J 15/06* (2006.01)
*B65G 49/07* (2006.01)

(52) U.S. Cl. ...................................... 294/64.1; 414/941

(58) Field of Classification Search ........ 294/64.1–64.3; 414/935, 936, 941; 901/40; 269/21; 279/3
See application file for complete search history.

(56) References Cited

U.S. PATENT DOCUMENTS

| 3,063,746 A | * | 11/1962 | Oakes ......................... 294/64.1 |
| 3,438,668 A | * | 4/1969 | Olsson et al. ................ 251/342 |
| 3,523,706 A | * | 8/1970 | Logue ......................... 294/64.3 |
| 4,029,351 A | * | 6/1977 | Apgar et al. ................... 271/97 |
| 5,564,682 A | * | 10/1996 | Tsuji ............................. 269/21 |
| 5,857,667 A | * | 1/1999 | Lee ............................... 269/21 |
| 6,095,582 A | * | 8/2000 | Siniaguine et al. ......... 294/64.3 |

FOREIGN PATENT DOCUMENTS

JP 62-255335 * 11/1987 .................. 414/941

* cited by examiner

*Primary Examiner*—Dean J. Kramer
(74) *Attorney, Agent, or Firm*—Arent Fox

(57) ABSTRACT

An apparatus for transferring a plate member such as a wafer by supporting the plate member with a plurality of support pins, and vacuum-sucking the plate member with a suction disk without allowing the suction disk to make contact with the plate member. Vacuum generated in a space between the plate member (51) and the suction disk (8) is introduced into a space between a hollow resilient body (3) via a conduit (11) formed in a lever (9), to drive the suction disk by expansion/contraction of the hollow resilient body, to attract the plate member without allowing the suction disk to make contact with the plate member, and to hold the plate member on the support pins (5). The suction disk has an outer ring area (49) on a suction surface (S) having at least one continuous groove surrounding the inner area of the suction disk. Vacuum is introduced into the inside of the suction surface (S) to suck the plate member.

11 Claims, 13 Drawing Sheets

CHUCK AND SUCTION BOARD FOR PLATES

CROSS-REFERENCE TO THE RELATED APPLICATION

This application is a continuation-in-part application of U.S. patent application Ser. No. 09/463,951, filed on Feb. 8, 2000, now abandoned which is originally PCT/JP99/03053 filed on Jun. 8, 1999. This application also claims priority of Japanese patent applications Hei 10-173798 filed on Jun. 8, 1998, and 2000-153811 filed on Apr. 18, 2000, the whole contents of which are incorporated herein by reference.

BACKGROUND OF THE INVENTION

1. Field of the Invention

The present invention relates to a chuck for holding and/or transferring or transporting a plate member such as a silicon wafer and to a suction board or disk used for such a chuck.

2. Description of the Related Art

Chucks for transferring a plate member between conveyors or between the inside and outside of a process system are known as described in Japanese Patent Publications No. 62-70141, No. 61-156749 and the like. A plate member is transported by bringing vacuum utilizing a suction device in direct contact with the plate member in order to suck and hold it and not to drop it during transportation. For example, a thin wafer disk is frequently transported during semiconductor manufacture processes. As a chuck using such a suction device is used, the suction device becomes in contact with a wafer to suck it. Therefore, a large amount of dirt or contamination is attached to the area of the wafer in contact with the suction device. The dirt attached to the suction device is also transferred and attached to the surface of another wafer as if the suction area of the former wafer is printed. The dirt hinders the succeeding manufacture processes and may cause a considerably lowered manufacture yield.

SUMMARY OF THE INVENTION

It is an object of the invention to provide a chuck for transferring a plate member by utilizing vacuum, capable of attaching less dirt to the plate member.

According to an aspect of this invention, there is provided a chuck using a suction board not in contact with a plate member. It is preferable that a suction surface of the suction board is formed with a labyrinth of a single or a plurality of continuous grooves, the groove being disposed surrounding the inner area of the suction board.

Vacuum is introduced into the inner area of the suction surface to suck the plate member. The chuck has a chuck body for supporting a plate member, a suction device having a suction board for sucking and fixing the plate member to the chuck body, and a hollow resilient or elastic device for driving the suction device.

A support arm of the chuck body has a plurality of support pins for supporting the plate member. The hollow elastic device for driving the suction board may use a bellows, for example. The suction device has one or more suction boards. The suction board and hollow elastic device communicate with each other via a conduit coupled to a vacuum source.

As the suction board comes near the plate member, the suction board communicating with the vacuum source sucks the plate member. The plate member while being supported with the support pins of the chuck body is elastically deformed by the suction force so that the suction area of the plate member is attracted toward the suction board.

In this case, vacuum generated in the upper space of the suction board is introduced at once to the hollow elastic device via the conduit. The inner pressure of the hollow elastic device is therefore lowered and the length of the hollow elastic device shortens. Information of this shortened length is transmitted to the suction device and the suction board of the suction device moves away from the plate member.

Conversely, as the suction board moves too far away from the plate member, a space between the suction board and plate member increases and the vacuum degree in the conduit is lowered. Therefore, the hollow elastic device expands at once and this information is transmitted to the suction device so that the suction board moves near to the plate member.

The suction board and plate member are therefore not in contact with each other and a clearance is always maintained between the suction board and plate member. The suction force of the suction board not in contact with the plate member holds the plate member and pushes the plate member against the support pins of the chuck body.

The suction force of the suction board is responded by the support pins mounted on the support arm of the chuck body. A friction force between the plate member and support pins generated by the reaction force of the suction force can be used while the plate member is transferred. The hollow elastic device may be a bellows, a piston and a cylinder in combination with a spring, a combination of a hollow space formed in the support arm of the chuck body and a diaphragm, or the like.

Since the suction board and plate member are not in contact with each other, dirt will not be generated during the suction by the suction board. Atmospheric air always enters the suction board via the clearance between the suction board and plate member. However, since the inside of the suction board is evacuated by the vacuum source, it is maintained at vacuum and the suction force of the suction board is retained.

The plate member is supported by a plurality of support pins, and dirt may be attached to the surface of the plate member in the supported areas. The material of the support pin is therefore selected so as to generate less dirt, or the support pins are disposed facing the outermost circumferential area of the plate member. Since the outermost circumferential area of the plate member is not used as the active area of the final product, dirt attached thereto may be permitted.

The chuck of the invention was used for holding a wafer for semiconductor manufacture. Since the suction board was not in contact with the wafer, dirt was not attached to the suction area of the wafer. The support pins of the chuck body are in contact with the wafer to hold it. Therefore, the number of dirt particles of 0.2 micron or larger attached to the chuck area of the wafer was 10, considerably reducing to about one fiftieth of a conventional vacuum chuck.

According to another aspect of this invention, there is provided a chuck for holding a plate member comprising: a suction member having a suction hole and a labyrinth of a plurality of continuous grooves not communicating each other, formed around the suction hole; a support for hermetically holding said suction member; and pins disposed on the suction member for supporting the plate member not in contact with the labyrinth and the support.

DESCRIPTION OF THE PREFERRED EMBODIMENTS

Modes for reducing the invention into practice will be described in connection with embodiments by referring to the accompanying drawings.

Figure 1:
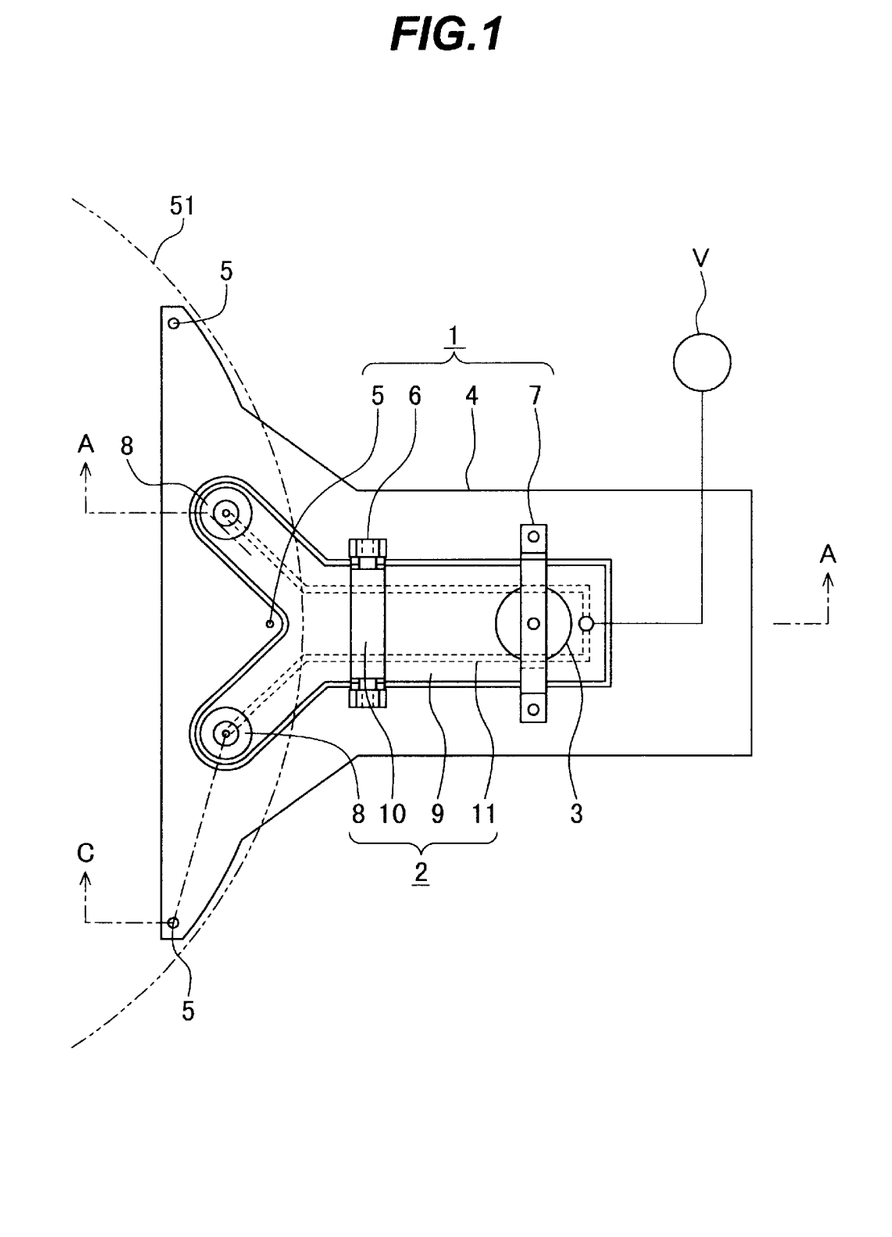
FIG. 1 is a plan view of a chuck showing a first embodiment of the invention.
Figure 2:
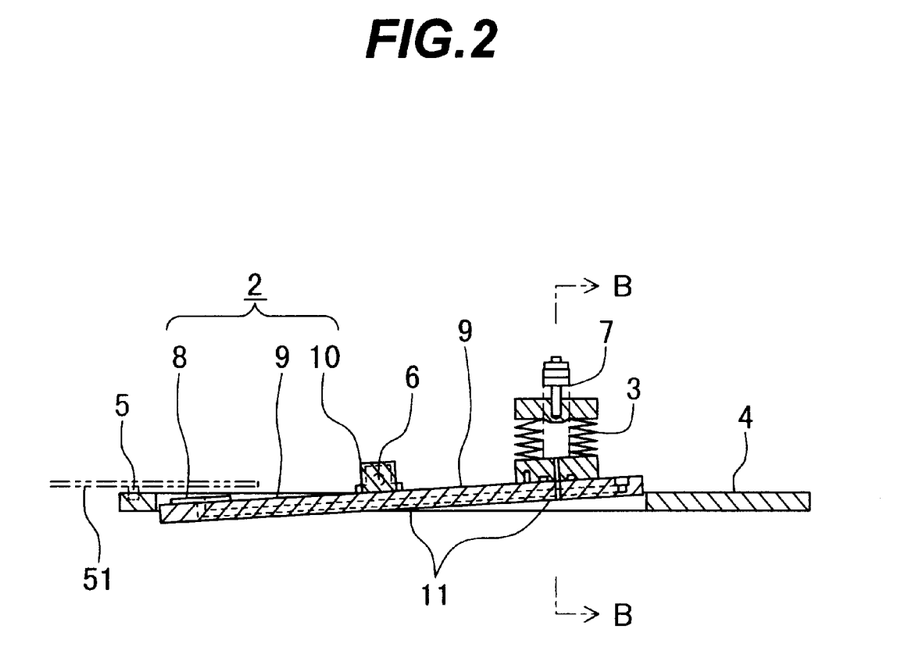
FIG. 2 is a cross sectional view taken along line A—A of FIG. 1.

FIGS. 1 to 4 show the first embodiment. Referring to FIGS. 1 and 2, a chuck has a chuck body 1 for holding a plate member 51, a suction device 2 for sucking and fixing the plate member 51 to the chuck body 1, and a hollow elastic device 3 for driving the suction device 2. In many cases, plate members are accommodated in a cassette in a stacked way with a small gap therebetween. It is therefore desired to thin the chuck so that the chuck can be inserted into any narrow gap in the cassette and can pull in or out a plate member 51 at any position in the cassette.

To this end, suction boards or disks 8 are mounted on a lever 9 at the position remote from the hollow resilient or elastic device 3. Mounted on a holding arm 4 of the chuck body 1 are support pins 5 for supporting the plate member 51, bearings 6 and a bracket 7. Mounted on the lever 9 of the suction device 2 are the suction disks 8 and a shaft 10.

The suction device 2 and chuck body 1 are coupled together at two positions. One position corresponds to the bearings 6 mounted on the support arm 4 of the chuck body 1. The bearings 6 receive the shaft 10 mounted on the lever 9. The other position corresponds to the position spaced apart from the bearing 6 in the direction opposite to the suction disk 8 by a distance between the suction disk 8 and bearing 6, at this position the lever 9 being connected to the bracket 7 via the hollow resilient or elastic device 3.

The inside of the hollow elastic device 3 communicates with a conduit 11 which is coupled to a vacuum source V. This conduit 11 extends to the space between the upper surface of the suction disk 8 and plate member 51.

Figure 3:
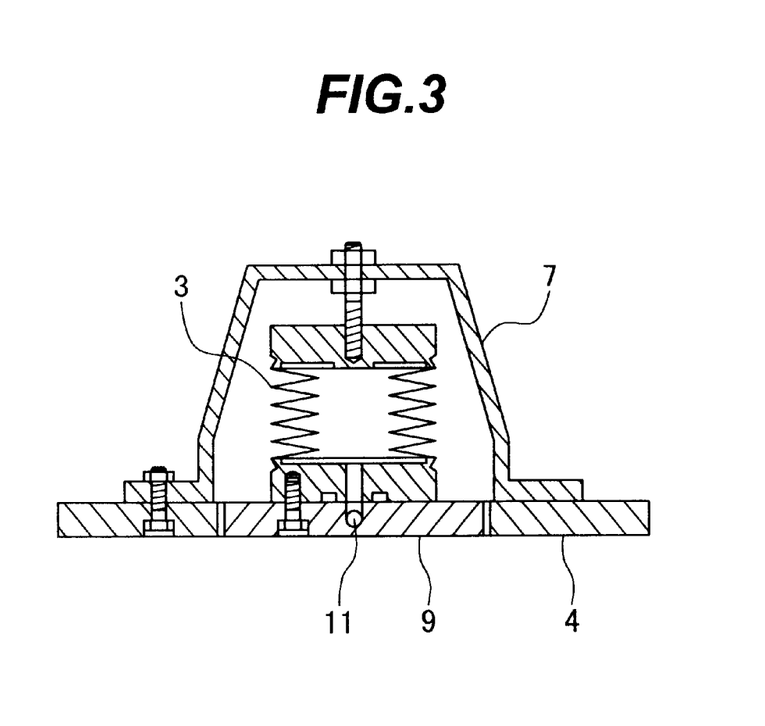
FIG. 3 is a cross sectional view taken along line B—B of FIG. 2.
Figure 4:
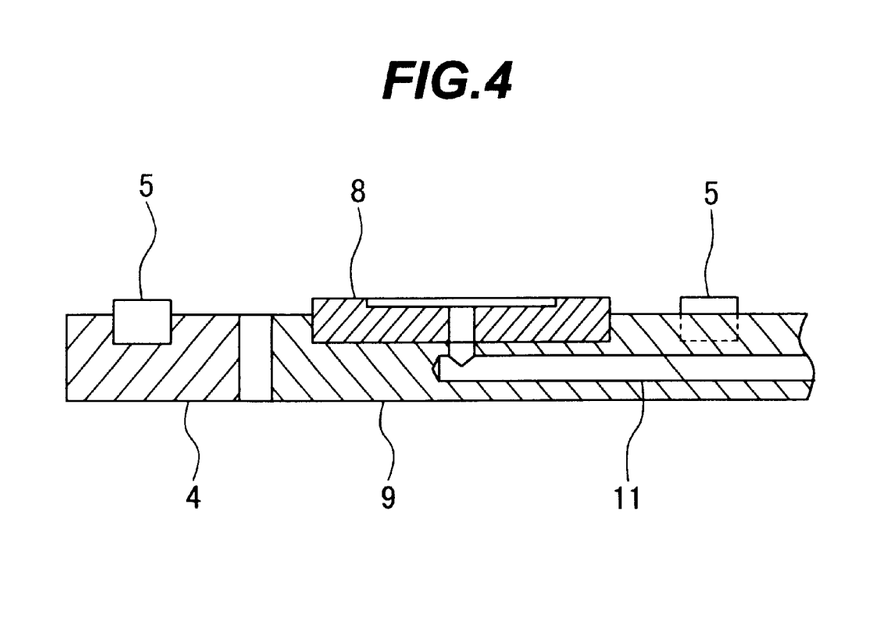
FIG. 4 is a cross sectional view taken along line C of FIG. 1.

FIG. 3 is a cross sectional view taken along line B—B of FIG. 2, and FIG. 4 is a cross sectional view taken along line C of FIG. 1 and showing the chuck including the suction disk 8 and support pins 5 shown in FIG. 1. The suction device 2 of this embodiment shown in FIGS. 1 to 4 has two suction disks 8. The number of suction disks may be one or more and any number can be selected.

The chuck for transferring a plate member is moved under the lower surface of the plate member 51, and the suction disks 8 coupled to the vacuum source V are moved upward to make the plate member 51 become in contact with the support pins 5. Alternatively, the plate member 51 is placed on the support pins 5 by another transport means.

When the plate member 51 becomes in contact with the support pins 5, the suction disks 8 come near the plate member 51 so that external air is suppressed from entering the suction disk 8 and the space between the plate member 51 and suction disks 8 becomes under vacuum.

This vacuum generated in the upper spaces of the suction disks 8 immediately propagates to the hollow elastic device 3 via the conduit 11. The inside of the hollow elastic device 3 therefore becomes vacuum same as in the upper spaces of the suction disks 8.

The inner vacuum state of the hollow elastic device 3 compresses the elastic member 3. Therefore, one end of the lever 9 is raised around the bearings 6, whereas the other ends of the lever 9 are lowered while the suction disks 8 suck the plate member 51. The plate member 51 is fixed to the support pins 5 while being flexed by elastic deformation.

The suction disks 8 and plate member 51 are not in contact with each other because of a small space therebetween. Therefore, dirt will neither be generated nor attached to the plate member 51 during suction by the suction disks. The plate member 51 can be held or transferred by using the friction force between the plate member 51 and support pins 5 generated by the suction force of the suction disks 8.

Figure 5:
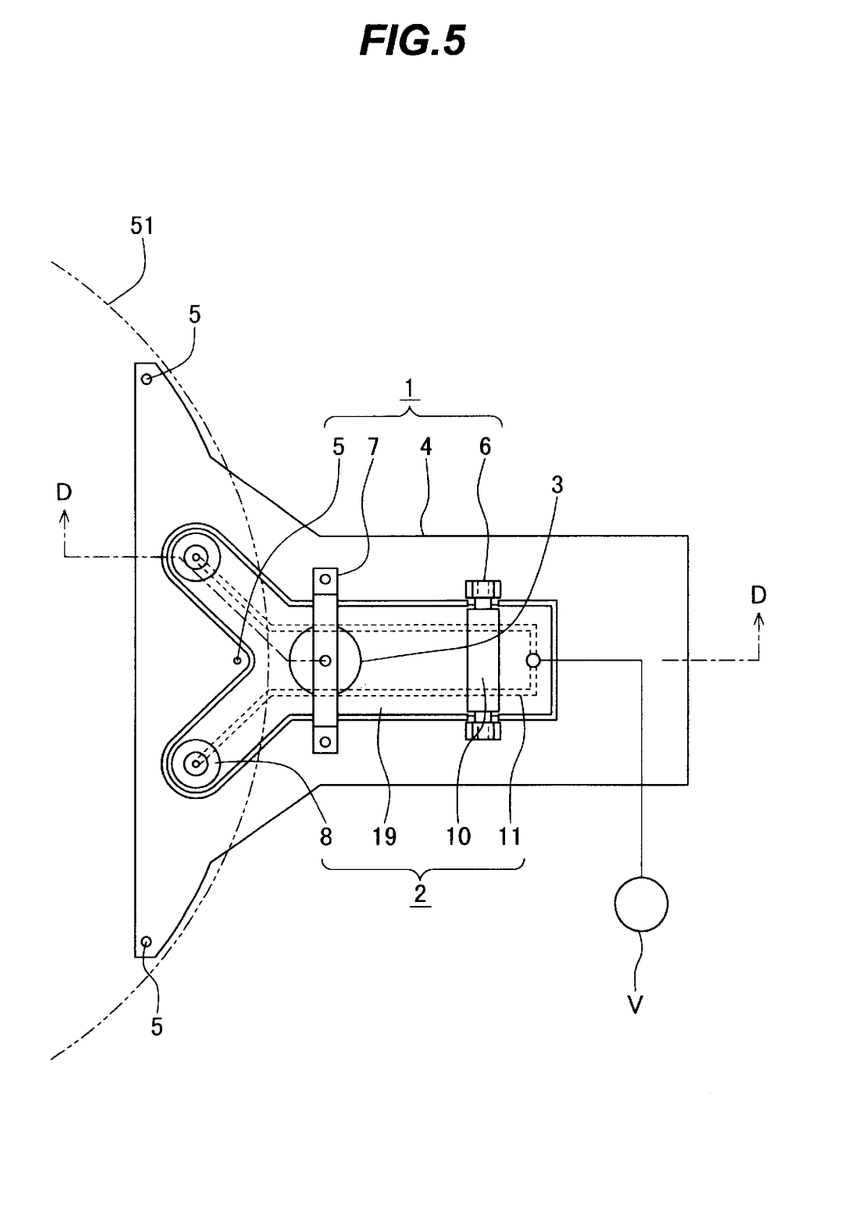
FIG. 5 is a plan view of a chuck showing a second embodiment of the invention.
Figure 6:
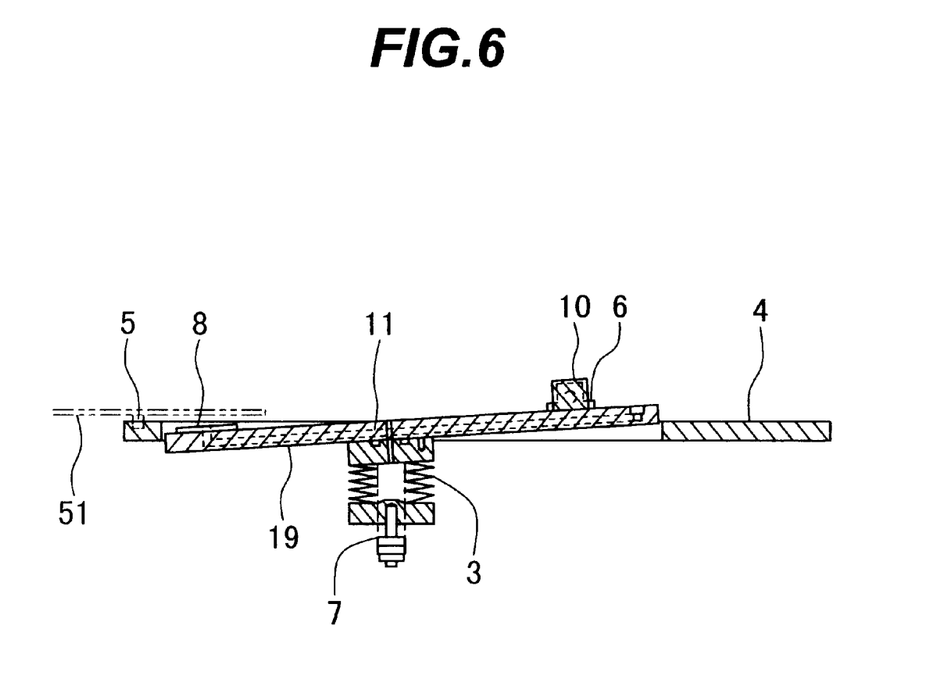
FIG. 6 is an elevational cross sectional view taken along line D—D of FIG. 5.

In the second embodiment shown in FIGS. 5 and 6, similar to the first embodiment, a chuck has a chuck body 1 for transferring a plate member, a suction device 2 for sucking and fixing the plate member to the chuck body 1, and a hollow elastic device 3. However, as being different from the first embodiment, the mount positions of a bracket 7 and bearings 6 on a support arm 4 of the chuck body 1 and the mount positions of a shaft 10 and the hollow elastic device 3 on a lever 19 of the suction device 2 are changed. The structures and functions of these components are similar to those of the first embodiment.

Figure 7:
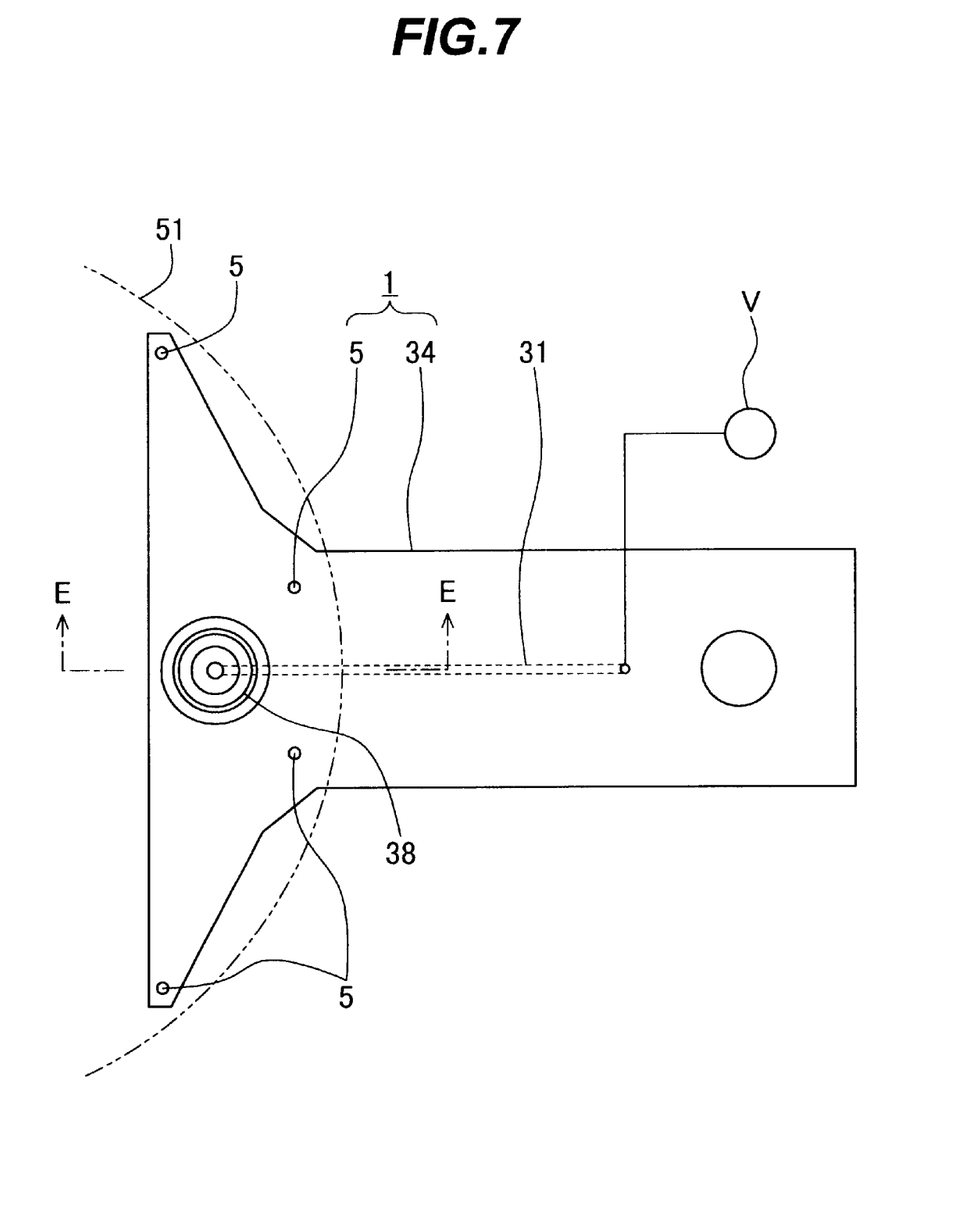
FIG. 7 is a plan view of a chuck showing a third embodiment of the invention.
Figure 8A:
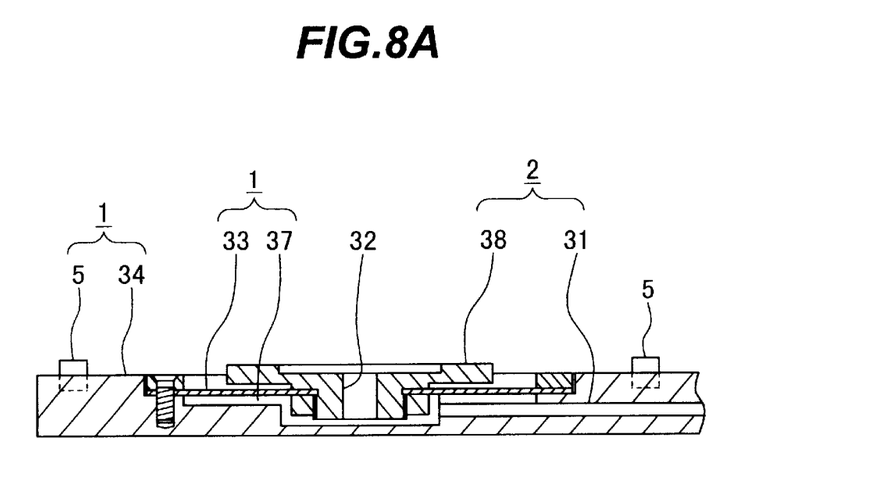
FIG. 8A is a detailed cross sectional view taken along line E—E of FIG. 7.

FIGS. 7 and 8A show the third embodiment. Similar to the first and second embodiments, a chuck has a chuck body 1 for holding a plate member 51, a suction device 2 for sucking and fixing the plate member 51 to the chuck body 1, and a hollow elastic device 3. In this embodiment, the hollow elastic device 3 is mounted on a support arm 34 of the chuck body 1. More specifically, the support arm 34 is provided with several support pins 5 and is formed with a hollow space 37 accommodating the hollow elastic device 3. The suction device 2 having a suction disk 38 is coupled to a diaphragm 33 which hermetically seals the inside of he hollow space 37.

A conduit 31 communicating with a vacuum source V is formed in the support arm 34 of the chuck body 1, and communicates with the inside of the suction disk 38 via the hollow space 37 and conduit 32. Vacuum is generated between the upper surface of the suction disk 38 and plate member 51 to suck the plate member 51. The plate member 51 supported by the support pins 5 is elastically deformed by the suction of the suction disk 38 and attracted toward the suction disk 38.

At the same time when the suction disk 38 sucks the plate member, the hollow space 37 becomes vacuum same as in the upper space of the suction disk 38. Therefore, the diaphragm 33 deflects and the suction disk 38 moves apart from the plate member 51. A space is therefore formed between the plate member 51 and the upper surface of the suction disk 38. The effective area and deflection of the diaphragm 33 are set so that the suction disk 38 and elastically deformed plate member 51 are not brought into contact with each other, while the suction disk 38 moves.

A small space is always formed between the upper surface of the suction disk 38 and the lower surface of the plate member 51 so that the suction disk 38 will not be in direct contact with the plate member 51. The plate member 51 can be transferred by using the friction force between the plate member 51 and support pins 5 generated by the suction force of the suction disks 38. The hollow space 37 may also be formed by assembling a cylinder in the support arm.

Figure 9:
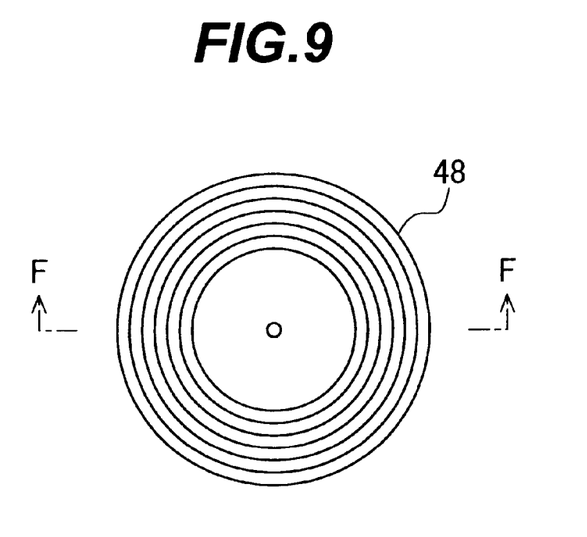
FIG. 9 is a plan view of a fundamental structure of the suction board of the invention.
Figure 10:
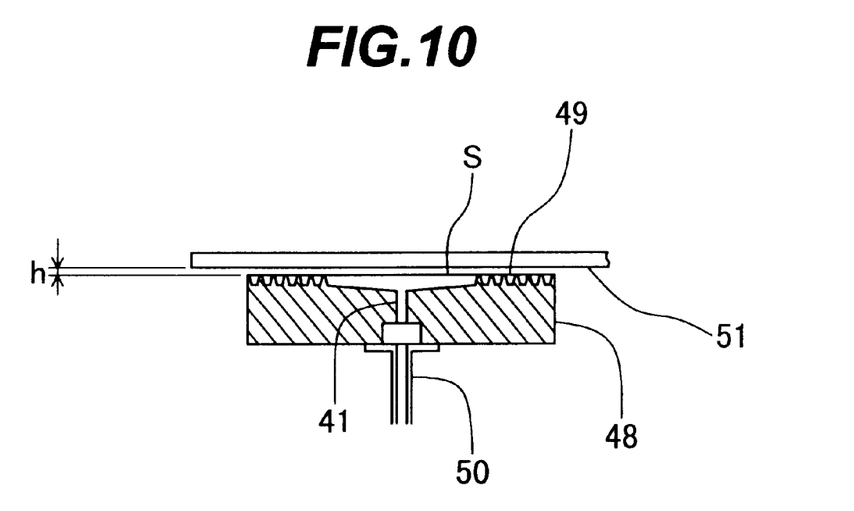
FIG. 10 is an elevational cross sectional view taken along line F—F of FIG. 9.

FIG. 10 shows a plate member 51 and a suction disk 48, with a suction surface S of the suction disk 48 being spaced apart from the plate member 51 by a gap h. FIG. 9 is a plan view schematically showing the suction surface S. The suction disk 48 has a center hole 41 which communicates with a vacuum source via a tube 50. The suction disk 48 sucks air in the gap between the plate member 51 and the suction surface S of the suction disk 48. Irrespective of circumferential air of the suction disk 48 entering the gap, the gap h is maintained vacuum so that the plate member 51 is attracted toward the suction disk 48.

The suction surface S of the suction disk 48 has an outer ring area 49 which is formed with a labyrinth of a single or a plurality of continuous grooves not communicating with each other, the groove being disposed surrounding the inner area of the suction disk. The outer space of the suction disk is at an atmospheric pressure so that the outer air can enter the central area of the suction disk, traversing the groove. In this case, the groove or grooves of the outer ring area 49 become a labyrinth which gives resistance to the flow of air and the amount of entering air can be reduced considerably. For this purpose, the multiple loop grooves should not be connected, but isolated from each other.

External air entered the groove of the outer ring area 49 of the suction disk forms an eddy air flow so that the kinetic energy of air is changed to heat and the external air maintains approximately an isoenthalpic state. In this state, the area of the gap between adjacent grooves gradually reduces, and the air pressure reduces gently at the outer groove and greatly reduces as the position moves toward the central area. This effects become more eminent the larger the number of grooves.

Figure 11:
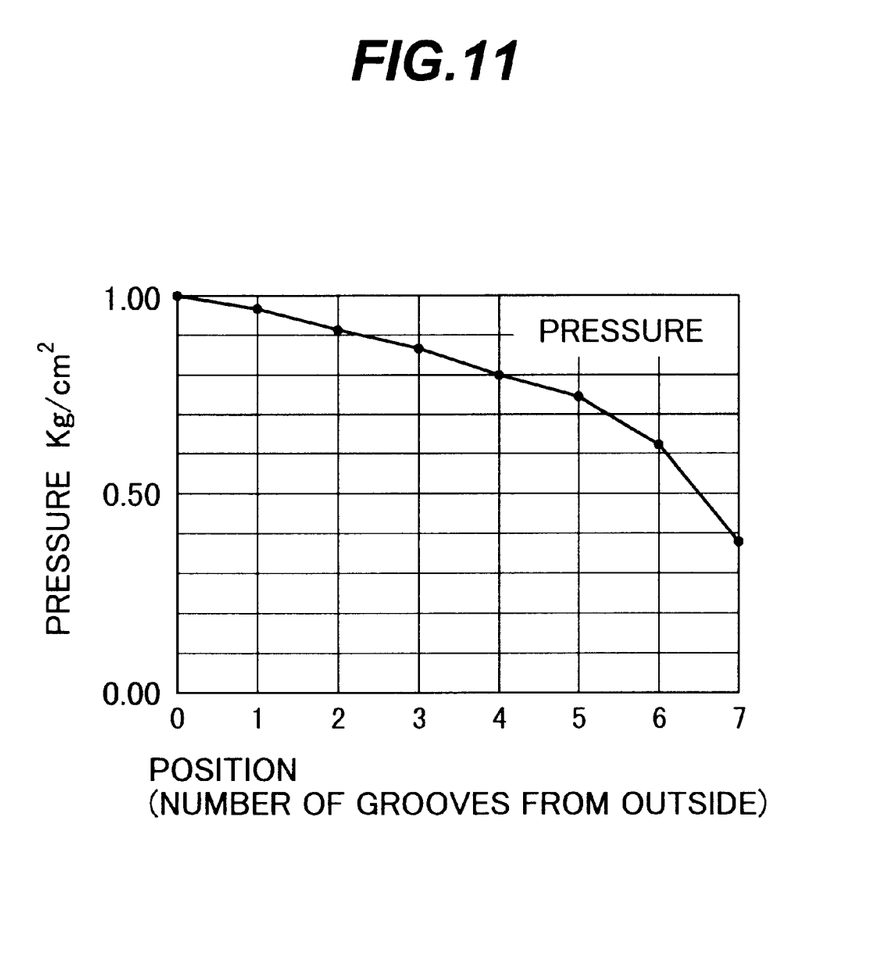
FIG. 11 is a graph showing the characteristics of a suction board of the invention.

FIG. 11 is a graph showing the relation between the groove position and the pressure in the groove while the suction disk 48 is under operation. A labyrinth of the outer ring area 49 of the suction disk 48 reduce the quantity of external air entering the central area of the suction disk 48. The capacity of the vacuum source necessary for the suction can therefore be reduced.

According to calculations, assuming that the same suction force is used for example, the quantity of external air passing through the suction disk 48 with the outer ring area 49 having seven grooves is about 36% of that of a suction disk with only one circumferential projection without any groove. Even if the suction surface of the suction disk 48 and the plate member 51 are not parallel at a small degree, the effects of reducing the incoming external air quantity is similar.

Figure 8B:
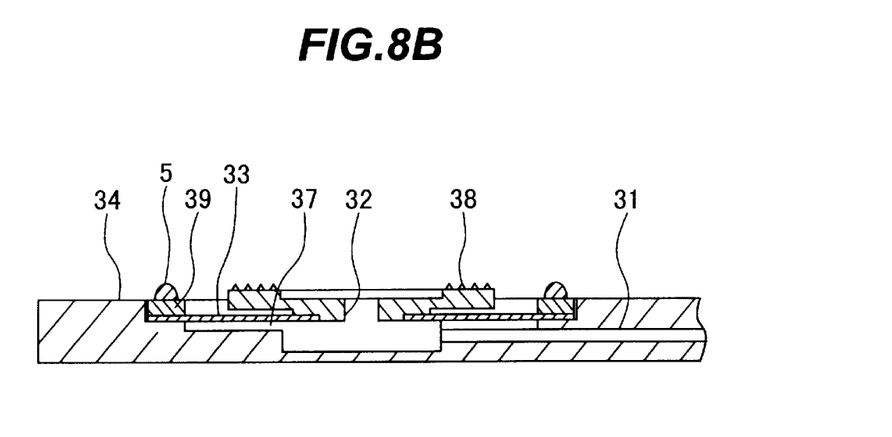
FIG. 8B is a cross sectional view of a modification of the structure of FIG. 8A.

FIG. 8B shows a modification of the chuck shown in FIG. 8A. In this structure, a suction disk 38 with central conduit 32 and labyrinth of a plurality of isolated loop grooves is adhered to a diaphragm 33. An outer ring 39 is also adhered to the diaphragm 33 to constitute an inner assembly. The inner assembly is inserted and fitted in a hollow portion of the arm 34, while the arm is heated to expand. A plurality of support pins 5 are formed on the outer ring 39, in place of on the arm 34. The accuracy of relative alignment of the labyrinth and the pins can be raised by forming the both in the inner assembly.

In the above described embodiments, there is provided some resilient means for providing flexibility between the arm and the suction board. However, there are cases where such flexibility is not necessary.

Figure 12A:
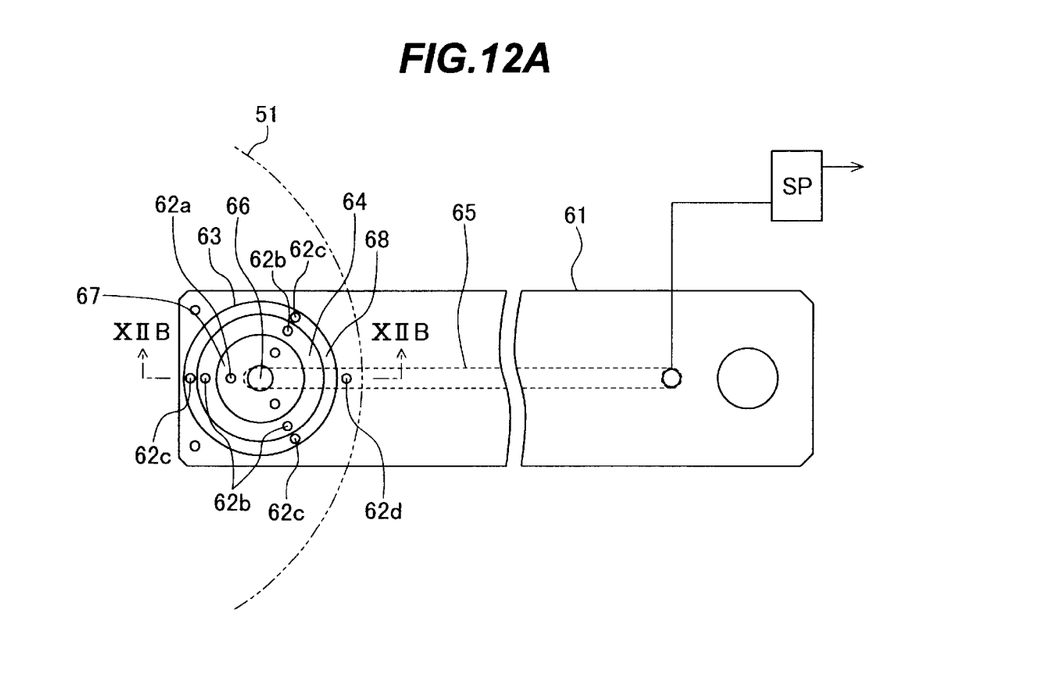
FIG. 12A and 12B are a plan view and a cross section of a chuck according to another embodiment of this invention.
Figure 12B:
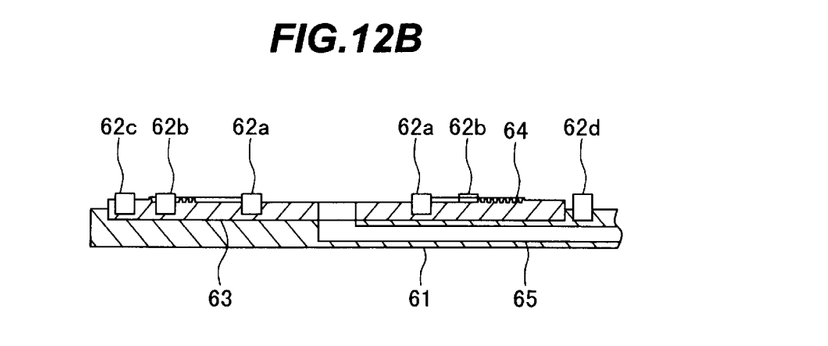

FIG. 12A is a plan view of a chuck according to another embodiment of this invention, FIG. 12B is an enlarged partial cross section of the chuck shown in FIG. 12A. The chuck comprises a support arm 61 for carrying and transporting a plate member 51, a suction board 63 having a suction hole 66 and fitted in a hollow of the support arm 61, and a plurality of support pins 62. The support arm 61 has a communication conduit 65 connected to a suction pump SP which sucks fluid around the suction board 63 through the hole 66. The suction pump SP may be a liquid pump such as a water pump when the fluid is liquid, e.g. water, and may be a vacuum pump when the fluid is gas. The suction board 63 has an annular region 64 where a continuous groove or a plurality of grooves are provided surrounding an inner region 67. These grooves, which may otherwise be fins, constitute planar labyrinth.

The support pins can be located at various positions, e.g. in any or any combination of (a) the inner region 67 inside the annular region 64, such as pins 62a, (b) the annular region 64 of labyrinth, such as pins 62b, (c) outer region 68 of the suction board 63 outside the annular region 64, such as pins 62c, and (d) the region of the support arm 61 surrounding the suction board 63, such as pins 62d. The grooves of labyrinth are formed to increase the resistance against the fluid flow across the grooves, not for allowing fluid to flow along the grooves. Therefore, pins may be formed in the labyrinth region filling part of the groove.

The outer pins 62c and 62d may be advantageous for supporting a large plate. The inner pins 62b may be advantageous to support a small plate. The further inner pins 62a are effective to decrease deformation of a plate member attracted, and may be preferably provided in accompany with either of both of the outer pins 62c, 62d and the inner pins 62b. In the figure, each plurality of pins are shown for each region, but any combination of pins is possible.

When a plate is positioned on the pins and the suction pump sucks the fluid around the suction board, the space on the inner region 67 surrounded by the labyrinth becomes of lower pressure than that of the exterior, and attracts the plate 51.

Figure 13:
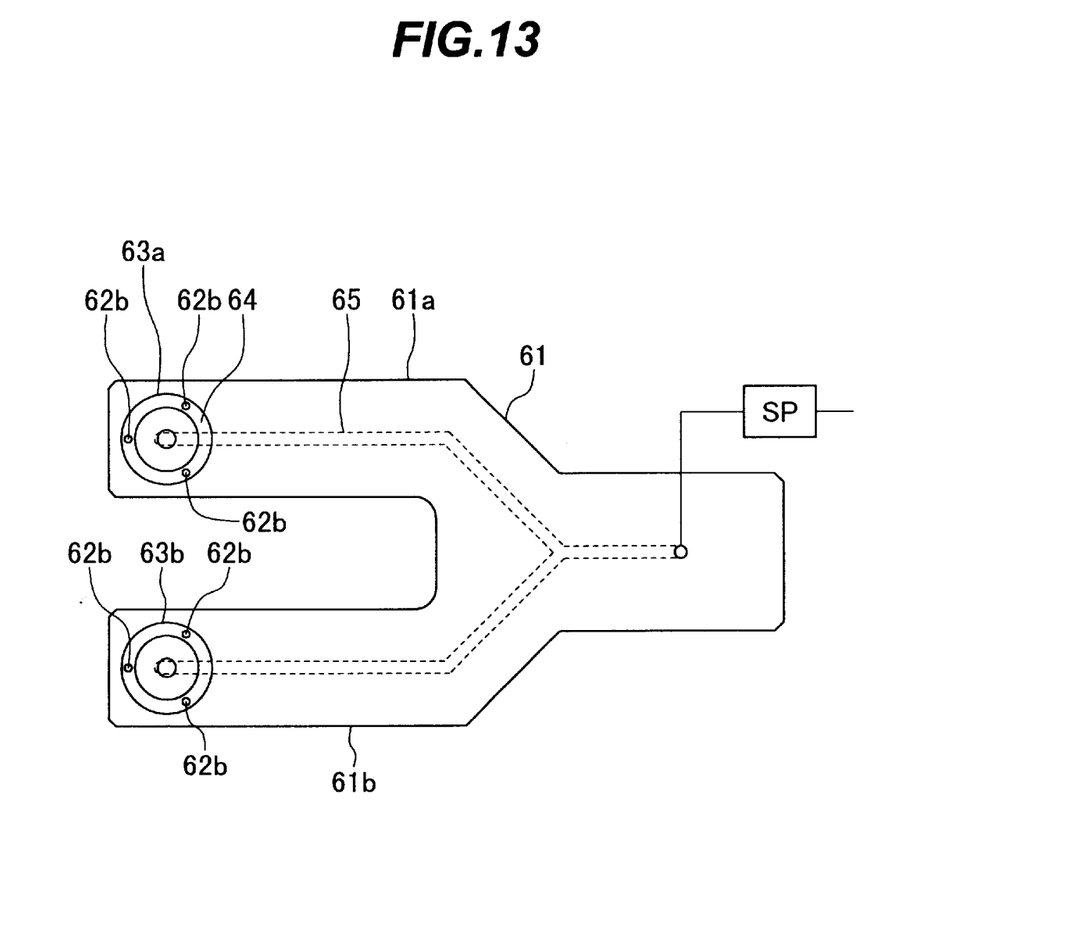
FIG. 13 is a plan view of a chuck according to further embodiment of the invention.

FIG. 13 shows an alteration of the embodiment shown in FIGS. 12A and 12B. The chuck has two suction boards 63a and 63b mounted on divided fork arms 61a and 61b which are branched from the root arm 61. Although pins 62b are provided only on the annular labyrinth region, pins may be provided in other regions. It is optional to provide pins outside and/or inside the labyrinth region, in place of or in addition to the pins in the labyrinth region.

Figure 14A:
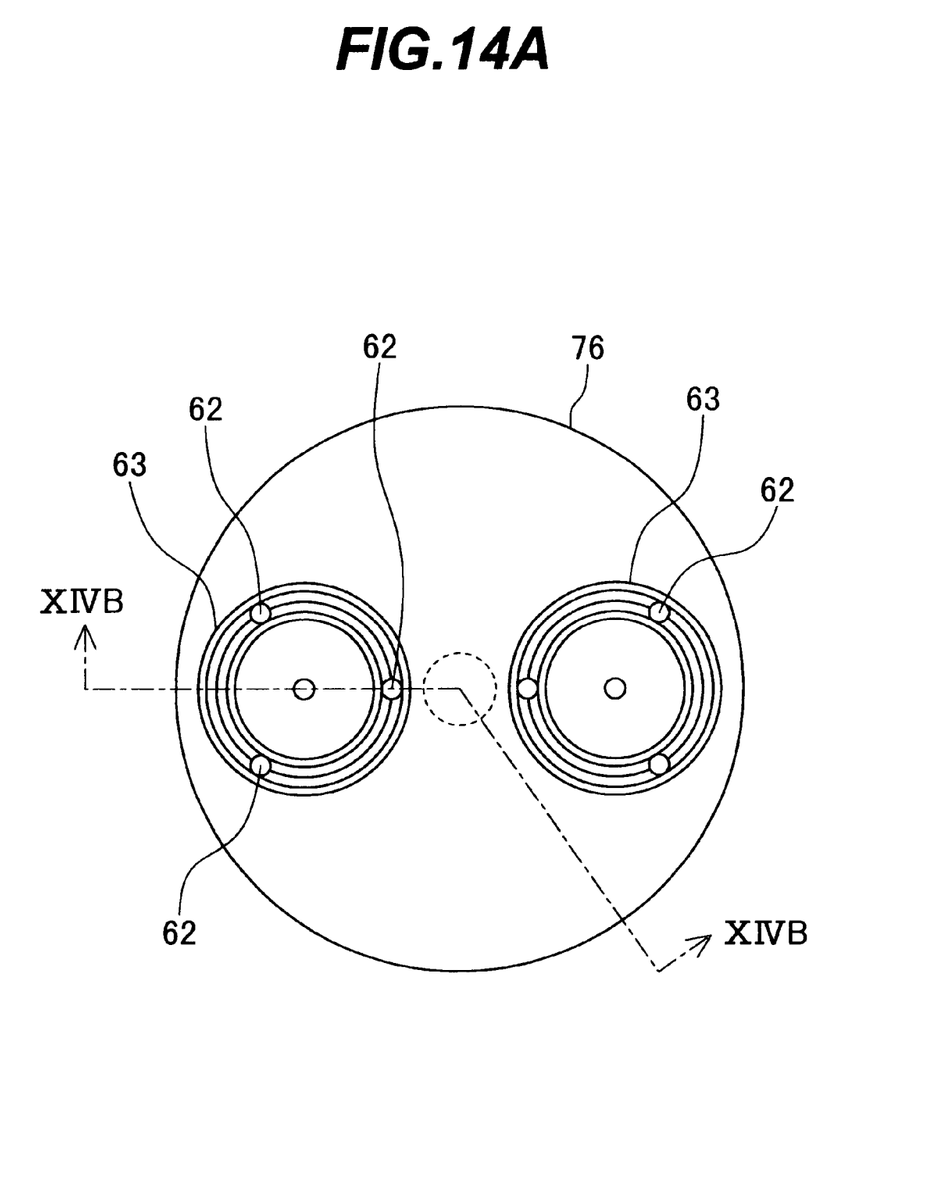
FIGS. 14A and 14B are a plan view and a cross section of a chuck according to yet further embodiment of this invention.
Figure 14B:
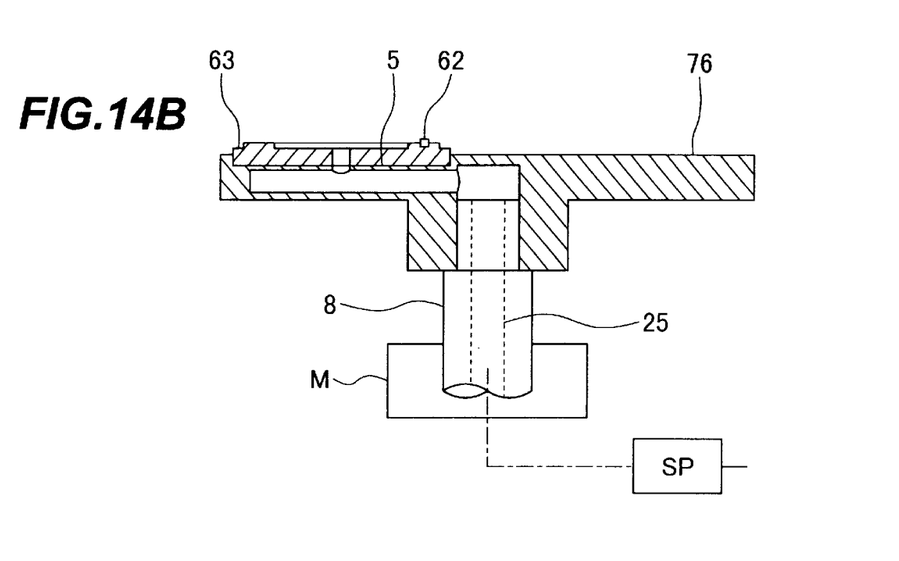

FIGS. 14A and 14B show a plan view and a partial cross section of a chuck according to another embodiment of the invention, adapted for holding and rotating a plate member such as a semiconductor wafer. A circular disk-shaped support 76 carries two suction boards 63 symmetrically around the center. Each suction board is hermetically coupled to the support 76. The support 76 is mounted on an axis 78 with a communicating conduit 79 which is connected to a suction pump SP. The axis 78 is rotated by a rotating driver such as a motor M. The number of suction boards can be changed arbitrarily, but it is preferable to dispose a plurality of suction boards symmetrically about the axis and separated from the center, for increasing the holding strength. In the suction board shown in the figure, there is no outer region outside the labyrinth region. This is effective to increase the area where suction force works. Support pins are disposed on the labyrinth region.

Figure 14C:
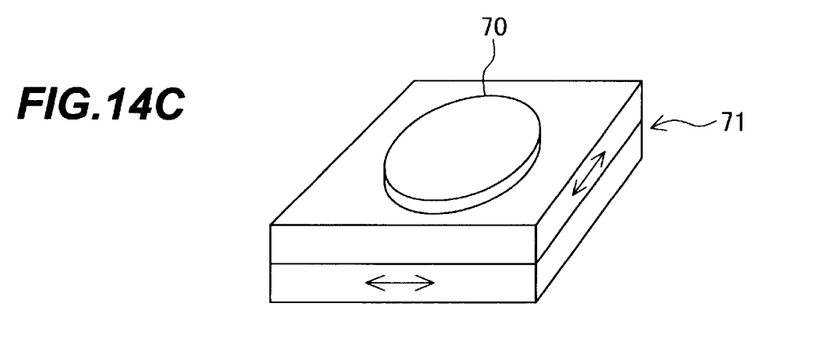
FIGS. 14C and 14D are schematic diagrams showing application of the chuck shown in FIGS. 14A and 14B.
Figure 14D:
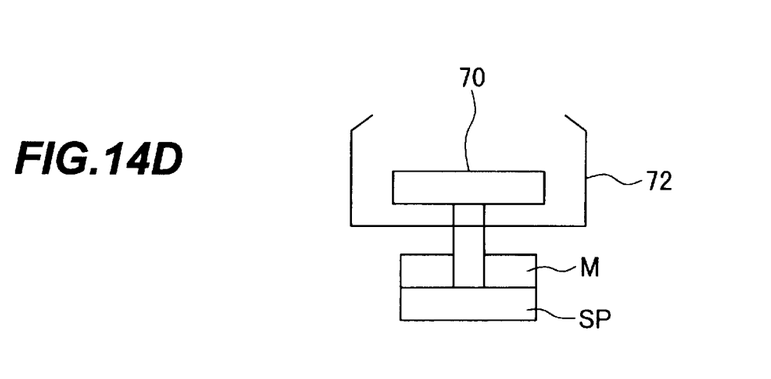

FIGS. 14C and 14D show application of the chuck shown in FIGS. 14A and 14B. In FIG. 14C, the rotary chuck 70 is mounted on an XY table 71 which can translate the rotary chuck in X and Y directions. The total mechanism realizes an XYΘ table, adapted for stepper to be used in a photolithography system. In FIG. 14D, the rotary chuck 70 is rotated in a housing 72, to realize a spinner for coating a liquid film on a wafer, or treat the wafer with liquid.

It will be apparent to those skilled in the art that various changes, modifications, alterations, substitutions, improvements and combinations thereof can be made.

INDUSTRIAL APPLICABILITY

The invention configured as described above has the following advantageous effects. The suction disk of the chuck facing a plate member with a gap therebetween can suck the plate member and hold it on the support pins, without generating dirt. An accident that the plate member is dropped while it is held, or held and transferred, can be prevented and dirt is not attached to the sucked area. The suction disk having a groove or grooves surrounding the central area of the disk can suck and hold a plate member while reducing the capacity of a vacuum source necessary for maintaining vacuum in the inside of the suction disk. The relative position of the chuck and plate member can be selected as desired. For example, if the chuck turned upside down is used, the plate member can be transferred being sucked and held with support pins at the upper surface of the plate member. The chuck may be used as an alternative of a pincette for holding a plate member. In any case, dirt will not be attached to the area of the plate member sucked by the suction disk. Yield and throughput of work pieces of plate members can therefore be improved.

What is claimed is:

1. A suction board comprising:
    an outer area having a labyrinth of a plurality of continuous grooves not communicating with each other and formed on a suction surface and surrounding an inner area of the suction board, wherein the labyrinth provides a pressure differential between the plurality of continuous grooves; and
    a hole formed in the suction board at a position in the inner area, for introducing vacuum to the suction surface to enable traction of a plate member without physical contact of the suction surface with the plate member.

2. A chuck comprising:
    a support including a vacuum path;
    a labyrinth of a plurality of continuous grooves not communicating with each other, wherein the labyrinth provides a pressure differential between the plurality of continuous grooves, formed on the support and coupled to the vacuum path; and
    pins for supporting a plate member to be not in contact with the labyrinth.

3. A chuck according to claim 2, wherein said pins are disposed on the support.

4. A chuck according to claim 2, wherein said labyrinth is disposed below top ends of said pins.

5. A suction board comprising:
    an outer area having a labyrinth of a plurality of concentric grooves not communicating with each other and formed on a suction surface and surrounding an inner area of the suction board, wherein the labyrinth provides a pressure differential between the plurality of concentric grooves;
    a hole formed in the suction board at a position in the inner area, for introducing vacuum to the suction surface to enable traction of a plate member; and
    a support for supporting the plate member to be not in physical contact with the suction surface.

6. A suction board according to claim 5, wherein said suction surface is generally planar.

7. A suction board according to claim 5, wherein said support includes a plurality of pins.

8. A suction board according to claim 7, wherein said labyrinth is disposed below top surfaces of said pins.

9. A chuck comprising:
    a base including a vacuum path;
    a vacuum source connected to the vacuum path;
    a labyrinth of a plurality of concentric grooves not communicating with each other, wherein the labyrinth provides a pressure differential between the plurality of concentric grooves, formed on the base and surrounding an area around said vacuum path; and
    pins for supporting a plate member to be not in physical contact with the labyrinth.

10. A chuck according to claim 9, wherein said pins are disposed on said base.

11. A chuck according to claim 9, wherein said labyrinth is disposed below top surfaces of said pins.

* * * * *